US012672234B2

(12) United States Patent
Gera

(10) Patent No.: US 12,672,234 B2
(45) Date of Patent: Jun. 30, 2026

(54) CONNECTING ARRANGEMENT

(71) Applicant: Robert Bosch GmbH, Stuttgart (DE)

(72) Inventor: Guenter Gera, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 280 days.

(21) Appl. No.: 18/548,771

(22) PCT Filed: Mar. 2, 2022

(86) PCT No.: PCT/EP2022/055208
§ 371 (c)(1),
(2) Date: Sep. 1, 2023

(87) PCT Pub. No.: WO2022/184747
PCT Pub. Date: Sep. 9, 2022

(65) Prior Publication Data
US 2024/0155766 A1 May 9, 2024

(30) Foreign Application Priority Data
Mar. 5, 2021 (DE) ..................... 10 2021 202 178.6

(51) Int. Cl.
*H05K 1/11* (2006.01)
*H05K 3/341* (2026.01)
(Continued)

(52) U.S. Cl.
CPC .......... *H05K 1/111* (2013.01); *H05K 3/3431* (2013.01); *H05K 3/363* (2013.01);
(Continued)

(58) Field of Classification Search
CPC .......... H05K 3/363; H05K 2203/0445; H05K 2203/046; H05K 1/11
(Continued)

(56) References Cited

U.S. PATENT DOCUMENTS

| | | | |
|---|---|---|---|
| 5,598,967 A | 2/1997 | Greenwood et al. | |
| 6,040,529 A | 3/2000 | Takeshita et al. | |

(Continued)

FOREIGN PATENT DOCUMENTS

| | | |
|---|---|---|
| DE | 10111389 A1 | 9/2002 |
| EP | 2290676 A1 | 3/2011 |

OTHER PUBLICATIONS

International Search Report for PCT/EP2022/055208, Issued Oct. 13, 2022.

*Primary Examiner* — Tremesha W Burns
(74) *Attorney, Agent, or Firm* — NORTON ROSE FULBRIGHT US LLP

(57) ABSTRACT

A connecting arrangement is disclosed. The connecting arrangement includes at least a first connecting partner and a second connecting partner, which are connected integrally together using a solidified solder layer, arranged between the connecting partners, with a solder layer thickness. Each connecting partner has a solder connection surface, which are wettable by the solder material in a molten state. The solder connection surfaces are arranged one above the other and face one another so that both are each contacted at least regionally by the solidified solder layer. Each solder connection surface is configured such that a perpendicular projection of both solder connection surfaces onto one another has at least one definable projection area with mutually overlapping solder connection surface parts. The definable projection area has a peripherally closed edge with at least one contained first cohesive projection sub-area, which is directly adjoined by at least one or more further projection sub-areas.

18 Claims, 4 Drawing Sheets

(51) Int. Cl.

| | |
|---|---|
| *H05K 3/36* | (2006.01) |
| *H10W 72/00* | (2026.01) |
| *H10W 72/59* | (2026.01) |
| *H10W 72/90* | (2026.01) |
| *H10W 90/00* | (2026.01) |

(52) U.S. Cl.
CPC .............. *H05K 2201/09381* (2013.01); *H05K 2203/046* (2013.01); *H10W 72/07336* (2026.01); *H10W 72/59* (2026.01); *H10W 72/931* (2026.01); *H10W 72/932* (2026.01); *H10W 90/734* (2026.01)

(58) Field of Classification Search
USPC ........................................................ 361/748
See application file for complete search history.

(56) References Cited

U.S. PATENT DOCUMENTS

| | | | |
|---|---|---|---|
| 6,608,366 | B1 | 8/2003 | Fogelson et al. |
| 2008/0298218 | A1 | 12/2008 | Tanaka et al. |

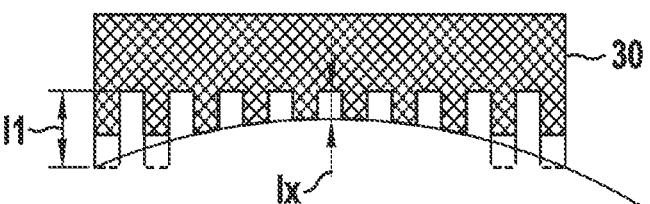
Fig. 3
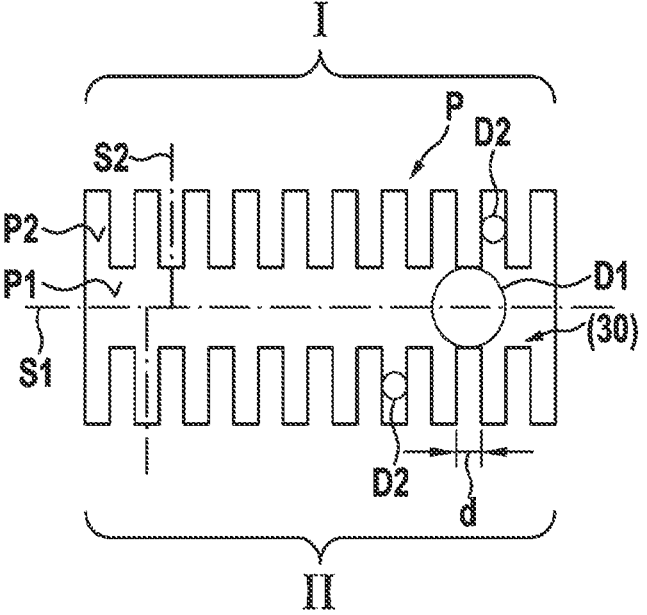
Fig. 4A
Fig. 4B

CONNECTING ARRANGEMENT

FIELD

The present invention relates to a connecting arrangement and to a method for the formation thereof.

BACKGROUND INFORMATION

The soldering technique is a common connection technique for electronic applications. In this case, a solder material is introduced between two components to be soldered and is subsequently melted. After a cooling process, both components are subsequently soldered together integrally. The solidified solder layer can assume an electrical and/or mechanical function within the respective electronic application. In soldering, it is often necessary to provide a defined quantity of solder material in order to ensure the functioning of the soldered joint. If too little solder material is present, the quality criteria of the soldered joint may not be achieved. This may lead to malfunction of the electronic circuit and/or may adversely affect the service life. If too much solder is present, so-called bleeding occurs or solder beads form. In particular, there is the risk in this case that other components are inadvertently electrically contacted by the pushed-out solder material and/or the formed solder beads, which can cause a short circuit during operation, for example. Accordingly, larger safety distances between thus soldered and adjacent components must be maintained. Due to fluctuations and tolerances in the manufacturing process, it is hardly possible to precisely meter solder quantities. In order to rule out quality issues, a little more solder than necessary is usually provided. This is contrary to a compact structure.

SUMMARY

In view of a further increasing pressure to miniaturize, the present invention is based on the object of controlling the accumulation of excess solder material locally within an electronic application in a defined manner.

This object may be achieved by a connecting arrangement and a method for the formation thereof according to features of the present invention.

The present invention proceeds from a connecting arrangement comprising at least a first connecting partner and a second connecting partner, which are connected integrally together by means of a solidified solder layer, arranged between the connecting partners, with a solder layer thickness. According to an example embodiment of the present invention, the connecting partners each have at least one solder connection surface, which are wettable by the solder material in a molten state. Furthermore, the solder connection surfaces are arranged one above the other and face one another so that both are each contacted at least regionally by the solidified solder layer. The solder connection surfaces are each designed such that a perpendicular projection of both solder connection surfaces onto one another has at least one definable projection area with in each case mutually overlapping solder connection surface parts. In this case, one of the solder connection surfaces can be specified as a reference surface, onto which a perpendicular projection of the other solder connection surface then takes place. The definable projection area can thus be perceived as a mutual overlapping or overlap region. Preferably, the solder connection surfaces are arranged parallel to one another, in particular in each case as a surface plane or surface curvature. In this way, the projections can be represented and determined particularly easily. The definable projection area then has at least one peripherally closed edge with at least one contained first cohesive projection sub-area, which is directly adjoined by at least one or more further projection sub-areas. In principle, the solder material in the molten or liquid state attempts to minimize its internal liquid pressure. In doing so, the solder material attempts to maximize the radii of curvature forming during wetting of the connecting partners. A dependence of the radii of curvature and the liquid pressure in the solder material is shown in the conventional Young-Laplace equation. What is desired now is a first cohesive projection sub-area whose structure size turns out to be larger in comparison to the one or to each of the further adjoined projection sub-areas. A large structure results in an energetically more favorable, large radius of curvature in the region of the respective solder connection surface part, whereas small structures result in an energetically unfavorable, small radius of curvature. Thus, in order to set a defined solder layer thickness, a solder connection surface part respectively corresponding to the further projection sub-area(s) is designed as an outlet collecting region for excess solder material between the connecting partners. This takes place in that, within the definable projection area, a structure size that is decisive for the wetting of the solder connection surface parts by the solder material in the molten state is designed to be larger in the first cohesive projection sub-area than in the one or more further projection sub-areas. The solder material in a liquid state therefore first wets or fills the solder connection surface parts in the region of the first cohesive projection sub-area with the structure size that is larger in comparison. Only thereafter does the liquid solder material then wet or flow into the overflow region with the structure size that is smaller in comparison, namely the one or more further projection sub-areas. The first cohesive projection sub-area is thus designed in terms of its size and shape such that it forms a functional solder connection region, which is required for the application and reliably meets all required quality criteria. On the other hand, the further projection sub-areas act as buffer regions, in which excess solder material can purposefully be locally drained and collected only after the required functional solder connection region has been fully formed. Depending on the quantity of the excess solder material present, the solder connection surface parts in the region of the one or more projection sub-areas are contacted more or less regionally by a then solidified solder layer. This also favors manufacture to the extent that process-related fluctuations and tolerances can easily be compensated via the buffer region and the electrical and/or mechanical functionality of the solder connection region is nevertheless always ensured. By the controlled local buffering of excess solder material, otherwise usable surfaces for the application can be determined unambiguously, which can advantageously then aim at a more compact design.

According to an example embodiment of the present invention, for an electronic application, a populatable substrate carrier may in particular be provided as the one or each of the two connecting partners. By way of example, DBC (Double Bonded Copper), AMB (Active Metal Brazing), LTCC (Low Temperature Cofired Ceramics), HTCC (High Temperature Cofired Ceramics) substrates, printed circuit boards (for example, FR4) or flex foils come into consideration. Thus, by way of a further example, two identical or different substrate carriers can be soldered together at a distance from one another. Likewise, an electrical and/or electronic component can be used as one of the connecting partners. An electronic device can have one or more identical or different such local connecting arrangements. The electronic device is preferably a compact power module.

In an advantageous development of the connecting arrangement according to the present invention, the first cohesive projection sub-area has the shape of a square, a rectangle, a circle or a circular segment, an oval, a trapezoid, a triangle, or a polygon, in particular a regular polygon. Such form elements from the solder connection surfaces can simply be represented as the first cohesive projection sub-area. In addition, the structure sizes in this case can be kept very simply larger in terms of continuous area than those in the region of the additionally adjoining further projection sub-areas. It is thus ruled out that solder connection surface parts in the region of the one or more further projection sub-areas are already wetted by liquid solder material before the solder connection surface parts are wetted in the entire region of the first cohesive projection sub-area. The reliable and defined formation of the aforementioned functional solder connection region is thus ensured.

In this sense, according to an example embodiment of the present invention, the one or more further projection sub-areas may have the shape of a square, a rectangle, a trapezoid, or a triangle. In principle, further shapes are possible. However, then always with a smaller structure size than the first cohesive projection sub-area. A general simple check for the structure size is made possible by determining a first maximum diameter of an incircle that can be inscribed in the first cohesive projection sub-area and by determining a second maximum diameter of an incircle that can be inscribed in one of the further projection sub-areas. In this case, the incircle contacts the edge of the respective surface and does not allow a larger diameter without then protruding beyond the edge. For example, in the case of a rectangular shape of the surface, such a maximum diameter of an inscribable incircle corresponds to the width of the rectangle. Reliable formations of an aforementioned functional solder connection region can be achieved in particular if the first maximum diameter is a multiple of the second maximum diameter, for example more than 2 times, in particular more than 5 times or 10 times said second maximum diameter.

In a development of the connecting arrangement of the present invention, the definable projection area comprises several further projection sub-areas, which are arranged spaced apart from one another at least as one cohesive group along at least one edge portion of the first cohesive projection sub-area. Further projection sub-areas are in particular arranged in a comb-like manner at equal distances from one another within the at least one cohesive group or all groups. In this way, the buffer region can be placed in a flexibly adaptable manner at a local location of the connecting arrangement that is free of components. In principle, it is also possible for the further projection sub-areas to be arranged peripherally to the first cohesive projection sub-area. In this way, a maximum buffer region for excess solder material can be provided. A very simple provision generally takes place if a respective orientation axis, in particular of all further projection sub-areas, is oriented perpendicularly to the edge portion of the first cohesive projection sub-area. In this case, for example, all further projection sub-areas are additionally designed to have the same shape and size. Alternatively, the further projection sub-areas within a cohesive group or between several groups may each extend with different length dimensions from the first cohesive projection sub-area. This has the effect that an otherwise differently heavy filling of the further projection sub-areas due to the liquid pressure of the liquid solder material can be leveled. As soon as a projection area part that is kept shorter in its length dimension and is otherwise more heavily filled is completely filled, other projection area parts that are otherwise not as heavily filled are filled more heavily. In addition, the effect can be used to strengthen mechanically heavily stressed edge locations of the aforementioned functional solder connection region by arranging, at these locations, further projection sub-areas that are filled more heavily with excess solder material due to coordinated length dimensions.

In an alternative embodiment of the connecting arrangement of the present invention, the first cohesive projection sub-area comprises two mirror-image, in particular straight, edge portions, wherein the several further projection sub-areas are arranged exclusively along an edge portion. Advantageously, further components of the connecting arrangement, for example electrical and/or electronic components, can then be placed directly next to the free edge portion without the risk of contact with excess solder material. Furthermore, alternatively, the further projection sub-areas can be arranged along both edge portions, in particular opposite or offset from one another in each case. This is primarily suitable for small structure sizes of the first cohesive projection sub-area in order to be able to provide a sufficient buffer region on an otherwise small surface.

According to an example embodiment of the present invention, it is generally advantageous if all further projection sub-areas are designed to have the same shape and size, wherein a width dimension of a further projection sub-area is one or multiple times, for example 2 times, in particular 5 times or 10 times, the dimension of a gap formed between two projection sub-areas. In particular, the gap dimension is measured between the locations where the respective projection sub-areas transition to the first cohesive projection sub-area. The gap dimension can in this case range to the smallest structural dimension for manufacturing-related reasons.

Advantageous embodiments of the connecting arrangement of the present invention are such that the further projection sub-areas together correspond to 10-50% of the surface size of the first cohesive projection sub-area. A required buffer size can thus be dimensioned in a manner adapted to the tolerances and fluctuations achievable during manufacture. Likewise, allowable tolerances can be increased if the manufacturing costs are advantageously lowered as a result.

An evenly peripherally closed edge of the definable projection area can be obtained by different shapes of the solder connection surfaces of the two connecting partners. It is in principle advantageous if the at least one peripherally closed edge of the definable projection area corresponds to one or even both solder connection surfaces. In this way, the solder connection surfaces can be kept very compact overall and produced in an economical manner. This is in particular true if the one solder connection surface is completely overlapped by the other solder connection surface.

In a further favorable embodiment of the connecting arrangement of the present invention, one edge profile corresponds to at least one or more first further projection sub-areas of a partial edge of one of the solder connection surfaces and one edge profile corresponds to at least one or more second further projection sub-areas of a partial edge of the other solder connection surface. In this way, very different application requirements can be implemented.

In particular, for the application in power modules, embodiments of the connecting arrangement of the present invention in which the first connecting partner is a ceramic carrier substrate, such as an AMB (Active Metal Brazing), a DBC (Double Bonded Copper), an LTCC (Low Temperature Cofired Ceramic), an HTCC (High Temperature Cofired Ceramic), or an IMS (Insulated Metal) substrate, have proven successful. This allows high power currents to be conducted. A power semiconductor that conducts such high power currents, for example as part of a B2 or B6 bridge, then comes into consideration as the second connecting partner, for example. Alternatively, the second connecting partner is a flex foil. The flex foil comprises, for example, a rewiring layer for connecting the power module to control electronics. In this case, the control electronics can control the switching states of power semiconductors of the power module, for example as part of a B2 or B6 bridge. The solder connection surfaces are in particular designed as metalliza-tion surfaces on the ceramic carrier substrate and/or the flex foil.

The present invention also results in a method for forming a connecting arrangement, in particular in one of the embodiments described above. The method comprises the following method steps:

a) forming a solder connection surface on each of the connecting partners, wherein the solder connection surfaces can be wetted by a solder material in the molten state, wherein the solder connection surfaces are each formed such that, in an arrangement of the two connecting partners according to method step b), at least one projection area with in each case mutually overlapping solder connection surface parts is defined in a perpendicular projection of both solder connection surfaces onto one another, wherein the definable pro-jection area has at least one peripherally closed edge with at least one contained first cohesive projection sub-area, which is directly adjoined by at least one or more further projection sub-areas, b) arranging the two connecting partners one above the other with the solder connection surfaces facing one another, in particular oriented parallel to one another, and at a distance from one another, wherein a solder material is arranged between the solder connection surfaces, wherein a sufficient solder quantity is selected for the formation of a solidified solder layer with a defined edge and layer thickness, c) melting the solder material to wet the solder connection surface parts, wherein all solder connection surfaces within the first cohesive projection sub-area are wetted first and, depending on excess solder material, the remaining solder connection surfaces within the further projection sub-area are only subsequently wetted at least regionally, d) cooling the solder material, wherein, in the region of the first cohesive projection sub-area, the solder layer is formed with an edge corresponding to the first cohesive projection sub-area, and with the defined layer thick-ness, wherein excess solder material is buffered in the region of the further projection sub-areas.

According to an example embodiment of the present invention, the solder material can, for example, be applied as a solder paste to one of the solder connection surfaces, for example by means of a solder paste printing process. Alter-natively, the solder material is present as a solder preform, which is arranged on one of the solder connection surfaces. Melting in particular takes place by tempering the connect-ing arrangement above a melting temperature of the solder material. The solder layer formed in the region of the first cohesive projection area corresponds to a required func-tional solder connection region of the connecting arrangement. For example, the functional solder connection region assumes an electrical and/or mechanical function, in par-ticular within the connecting arrangement as part of an electronic application, for example a power module.

BRIEF DESCRIPTION OF THE DRAWINGS

Additional advantages, features and details of the present invention result from the following description of preferred exemplary embodiments and with reference to the figures.

FIG. 3 shows a further exemplarily formed solder layer within the connecting arrangement of FIG. 1, according to the present invention.

FIGS. 4A-4D show further exemplary definable projec-tion areas according to the present invention.

DETAILED DESCRIPTION OF EXAMPLE EMBODIMENTS

In the figures, functionally identical components are in each case denoted by identical reference signs.

Figure 1:
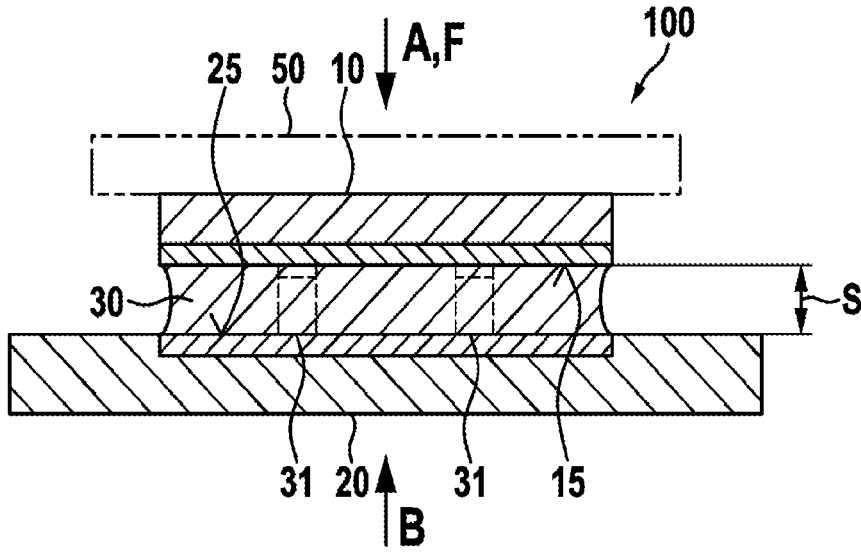
FIG. 1 shows a connecting arrangement in a lateral sectional view, according to an example embodiment of the present invention.

In FIG. 1, a connecting arrangement 100 is shown purely schematically in a lateral sectional view. The connecting arrangement 100 comprises two connecting partners 10, 20, which are materially connected to one another. The con-necting arrangement 100 is, for example, part of an elec-tronic device, furthermore, for example, part of a power module. One of the connecting partners 20 is preferably a circuit carrier, in particular a ceramic carrier substrate, e.g., an AMB, a DBC, an LTCC, an HTCC or an IMS substrate. The other connecting partner 10 is, by way of example, an electrical and/or electronic component, furthermore, by way of example, a part of a power electronics of the power module, in particular of a B2 or B6 bridge. Alternatively, the other connecting partner 10 is a further carrier substrate, such as the already mentioned carrier substrates or a printed circuit board or a flex foil. In particular, the further carrier substrate 10 comprises a rewiring layer, in particular for electrically contacting a control device of the power module.

A solidified solder layer 30 with a solder layer thickness s is arranged between the connecting partners 10, 20. By way of example, the solder layer thickness s is set in a defined manner by means of spacers 31 contained within the solder layer 30. Both connecting partners 10, 20 each have a solder connection surface 15, 25. In this exemplary embodiment, these surfaces are arranged parallel to one another and facing one another. For example, they are applied as local mentalizations to the upper sides of the respective connecting partner 10, 20. Depending on the shape of the solder connection surfaces 15, 25 and depend-ing on a solder quantity contained in the solder layer 30, they are contacted at least regionally.

Figure 2:
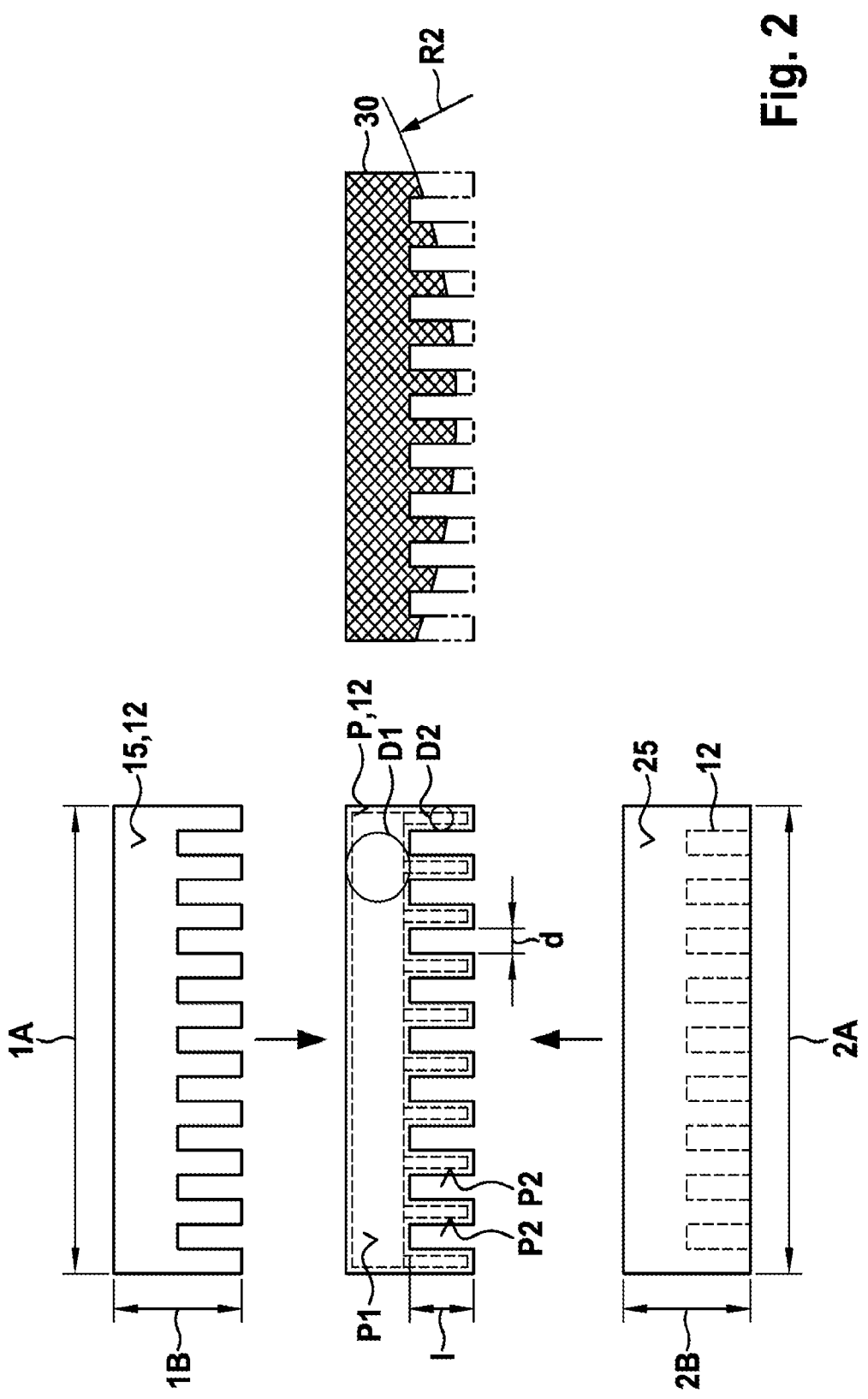
FIG. 2 shows solder connection surfaces and, by way of example, a projection area that can be defined therefrom, in a perpendicular projection from a view A or B, according to the present invention.

In FIG. 2, exemplary shapes of the solder connection surfaces 15, 25 are shown in a view A and B. For example, at the top, the figure shows the solder connection surface 15 of the first connecting partner 10. On the other hand, the bottom of the figure then shows the solder connection surface 25 of the second connecting partner 20. In the center of the figure, on the left, a perpendicular projection of both solder connection surfaces 15, 25 onto one another is shown.

The projection area P shown comprises solder connection surface parts 12, which mutually overlap, i.e., form a common overlap region. The projection area P can be divided into a structurally larger first cohesive projection sub-area P1 and several structurally smaller further projection sub-areas P2, which in turn directly adjoin the first cohesive projection sub-area P1. The definable projection area P thus has a closed peripheral edge. For example, the first cohesive projection sub-area P1 is designed as an elongate rectangle. All further projection sub-areas P2 are, for example, likewise formed rectangularly and are arranged along an edge portion of the first cohesive projection sub-area P1. Preferably, the further projection sub-areas P2 have equal distances from one another, in particular with equal gap dimensions b between one another. In this way, a type of comb structure results on one side. In principle, the projection area P in this form can be defined by different shapes of the respective solder connection surfaces 15, 25. In the example shown, the definable projection area P exactly corresponds to the shape of the solder connection surface 15 of the first connecting partner 10. Although the solder connection surface 25 of the second connecting partner 20 has the same outer dimensions 2A, 2B as the outer dimensions 1A, 1B of the solder connection surface 15, it is formed as a rectangle over its entire area. The same projection area P would also result if one of the outer dimensions 2A, 2B or both are larger than the outer dimensions 1A, 1B. The same applies if the solder connection surface 25 projects beyond all outer dimensions 1A, 1B with a shape that deviates from a rectangle. If the two solder connection surfaces 15, 25 correspond to one another in their shape like that of the solder connection surface 15, the projection area P likewise results in the form shown. The structure size of the first cohesive projection sub-area P1 is in principle larger than that of the further projection sub-areas P2. This is shown in particular by the comparison of incircles that can be maximally inscribed in each case into the projection sub-areas P1, P2. Thus, within the first cohesive projection sub-area P1, a maximum diameter D1 of the incircle results, which is greater than a maximum diameter D2 within the respective further projection sub-areas P2. In this example, the diameters D1, D2 also correspond to the respective widths of the rectangular surfaces. Due to the structure size differences, there is a controlled wetting of the solder connection surface parts 12 if the solder material is in the liquid state when the connecting arrangement is formed. Thus, the liquid solder material, following the principle of minimized solder liquid pressure, will always first completely wet the solder connection surface parts 12 in the region of the first cohesive projection area P1 due to their larger structure size, before the solder connection surface parts 12 in the region of the further projection sub-areas P2 are subsequently wetted or filled regionally. The solder quantity for the solder layer 30 forming between the two connecting partners 10, 20 is dimensioned such that a functionally required solder connection region with a defined solder layer thickness s forms reliably and completely within the first cohesive projection area P1. For the excess solder material, the solder connection surface parts 12 in the region of the further projection sub-areas P2 then act as a defined outlet collecting region, which are contacted more or less strongly depending on the excess solder quantity. In the center of FIG. 2, on the right, the formed solidified solder layer 30 with a defined solder layer thickness s is shown. The outlet collecting region indicates a differently heavy filling of the solder connection surface parts 12 in the region of the respective further projection sub-areas P2. In particular, a respective outlet front along a circular segment results with P2. This is due to the tendency of the solder material to adjust a minimum solder liquid pressure. Leveling of the outlet fronts can be achieved by designing the further projection sub-areas P2 with the widest outlet front to be shortened. Thus, FIG. 3 shows a projection area P, in which the lengths 11, lx of the respective further projection sub-areas P2 are increasingly shortened from an outer arrangement to an inner arrangement. In comparison to the embodiment in FIG. 2, the inner outlet fronts have shortened, while the outer outlet fronts have lengthened overall.

The formation of the connecting arrangement takes place very simply. For this purpose, solder connection surfaces 15, 25 described above are accordingly formed on the two connecting partners 10, 20. Both connecting partners 10, 20 are then arranged one above the other with the solder connection surfaces facing one another, in particular oriented parallel to one another, and at a distance from one another. A solder material, for example in the form of a printed solder paste or a solder preform, is arranged between the solder connection surfaces 15, 25. The arrangement is thereupon tempered above a melting temperature of the solder material, and the solder material is melted. Upon cooling of the solder material, the aforementioned solidified solder layer 30 is formed. The setting of a defined solder layer thickness s can be ensured by applying force to at least one of the connecting partners 10, 20 by means of a tool holding element 50 during the tempering until the solidification of the solder material, such that it is pressed against the spacer elements 31 and held. The height of the spacer elements 31 then determines the defined solder layer thickness s. In principle, non-contacted solder connection surface parts 12 in the region of the further projection sub-areas P2 indicate a measure for a still remaining buffer capacity for excess solder material.

Other configurations of the connecting arrangement 100 are shown in FIGS. 4A to 4D. In particular, depending on the respective solder connection surfaces 15, 25 formed, they show different definable projection areas P.

FIG. 4A shows a projection area P which, in comparison to the projection area as shown in FIG. 2, has further projection sub-areas P2 arranged opposite one another and along the two long edge portions I and II. Alternatively, the further projection sub-areas P2 of the respective edge portions I, II can be offset from one another.

FIG. 4B shows a projection area P which has a square first cohesive projection sub-area P1 in comparison to the projection areas as shown in FIGS. 2 and 4A. The further projection sub-areas P2 are in this case arranged peripherally to the first cohesive projection sub-area P1.

Figure 4C:
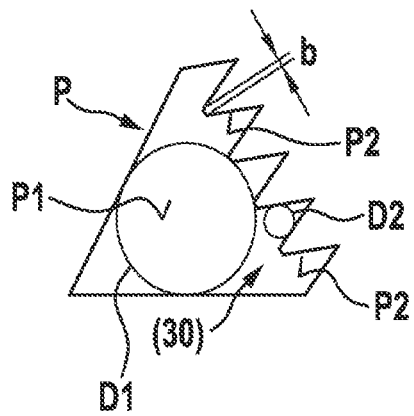

FIG. 4C shows a further projection area P which has a triangular first cohesive projection sub-area P1 in comparison to the projection areas shown so far. The further projection sub-areas P2 are likewise triangular and are arranged along one of the triangle sides or along two or three of the triangle sides (not shown).

Figure 4D:
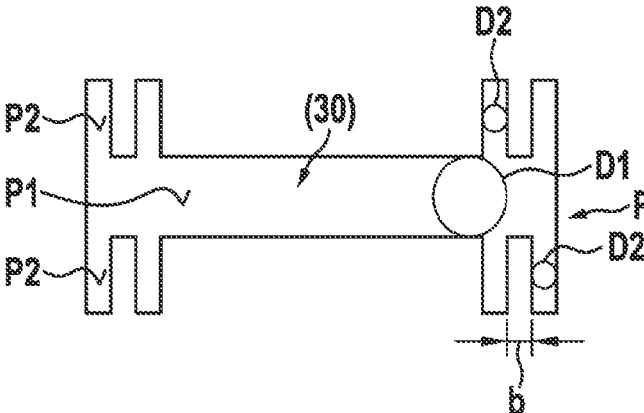

FIG. 4D shows a further projection area P which, in comparison to the projection area P as shown in 4a, has further projection sub-areas P2 only in the outer region of the rectangular first cohesive projection sub-area P1.

In principle, shapes of other projection areas P are still possible, in particular as a combination of at least two or more of the described projection sub-areas P1, P2. Such a combination may include the following embodiments. Thus, the first projection sub-area P1 may also have the shape of a circle or a circular segment, an oval, a trapezoid, or a polygon, in particular a regular polygon. Likewise, the further projection sub-areas P2 may have the shape of a square or trapezoid.

The invention claimed is:

1. A connecting arrangement, comprising:

a first connecting partner and a second connecting partner, which are connected integrally together using a solidified solder layer, arranged between the connecting partners, with a solder layer thickness, each of the connecting partners has at least one solder connection surface, the solder connection surfaces being wettable by a solder material in a molten state, and being arranged one above the other and are each contacted at least regionally by the solidified solder layer;

wherein the solder connection surfaces are each designed such that a perpendicular projection of both solder connection surfaces onto one another has at least one definable projection area with in each case mutually overlapping solder connection surface parts;

wherein the at least one definable projection area has at least one peripherally closed edge with at least one contained first cohesive projection sub-area, which is directly adjoined by at least one or more further projection sub-areas; and wherein, to set a defined solder layer thickness, a solder connection surface part respectively corresponding to the one or more further projection sub-areas is configured as an outlet collecting region for excess solder material between the connecting partners in that, within the at least one definable projection area, a structure size that is decisive for the wetting of the solder connection surface parts by the solder material in the molten state is configured to be larger in the at least one first cohesive projection sub-area than in the one or more further projection sub-areas.

2. The connecting arrangement according to claim 1, wherein the solder connection surfaces are arranged parallel to one another.

3. The connecting arrangement according to claim 1, wherein the at least one first cohesive projection sub-area has a shape of a square, or a rectangle, or a circle, or a circular segment, or an oval, or a trapezoid, or a triangle, or a polygon, or a regular polygon.

4. The connecting arrangement according to claim 1, wherein the one or more further projection sub-areas has a shape of a square, or a rectangle, or a trapezoid, or a triangle.

5. The connecting arrangement according to claim 1, wherein the at least one definable projection area includes several further projection sub-areas which are arranged spaced apart from one another at least as one cohesive group along at least one edge portion of the at least one first cohesive projection sub-area, in a comb-like manner at equal distances from one another within the at least one cohesive group or all groups.

6. The connecting arrangement according to claim 5, wherein the at least one first cohesive projection sub-area includes two mirror-image straight, edge portions, wherein the several further projection sub-areas are arranged exclusively along one edge portion or along the two edge portions opposite or offset from one another in each case.

7. The connecting arrangement according to claim 5, wherein the several further projection sub-areas are arranged peripherally to the at least one first cohesive projection sub-area.

8. The connecting arrangement according to claim 5, wherein all of the further projection sub-areas have the same design, wherein a width dimension of each of the further projection sub-areas is one or multiple times a dimension of a gap formed between two of the further projection sub-areas.

9. The connecting arrangement according to claim 1, wherein the one or more further projection sub-areas correspond to 10-50% of a surface size of the at least one first cohesive projection sub-area.

10. The connecting arrangement according to claim 1, wherein the at least one peripherally closed edge of the at least one definable projection area corresponds to at least one peripherally closed edge of one or both of the solder connection surfaces.

11. The connecting arrangement according to claim 1, wherein one of the solder connection surfaces is completely overlapped by the other of the solder connection surfaces.

12. The connecting arrangement according to claim 1, wherein one edge profile of at least one or more further projection sub-areas corresponds to a partial edge of one of the solder connection surfaces, and another edge profile of at least one or more other further projection sub-areas corresponds to a partial edge of the other solder connection surface.

13. The connecting arrangement according to claim 1, wherein the structure size is determined by a first maximum diameter of an incircle within the at least one first cohesive projection sub-area and by a second maximum diameter of an incircle within one of the further projection sub-areas, wherein the first maximum diameter is a multiple of the second maximum diameter.

14. The connecting arrangement according to claim 1, wherein the first connecting partner is a ceramic carrier substrate, and the second connecting partner is a flex foil.

15. The connecting arrangement according to claim 14, wherein the ceramic carrier substrate is an AMB, or a DBC, or an LTCC, or an HTCC, or an IMS substrate.

16. A method for forming a connecting arrangement, the connecting arrangement including a first and a second connecting partner, the method comprising the following steps: a) forming a solder connection surface on each of the connecting partners, wherein the solder connection surfaces can be wetted by a solder material in a molten state, wherein the solder connection surfaces are each formed such that, in an arrangement of the two connecting partners according to step b), at least one definable projection area with in each case mutually overlapping solder connection surface parts is defined in a perpendicular projection of both solder connection surfaces onto one another, wherein the at least one definable projection area has at least one peripherally closed edge with at least one contained first cohesive projection sub-area, which is directly adjoined by at least one or more further projection sub-areas; b) arranging the two connecting partners one above the other with the solder connection surfaces facing one another oriented parallel to one another, and at a distance from one another, wherein the solder material is arranged between the solder connection surfaces, wherein a sufficient solder quantity is selected for formation of a solidified solder layer with a defined edge and layer thickness; c) melting the solder material and wetting the solder connection surface parts, wherein all solder connection surface parts within the at least one first cohesive projection sub-area are wetted first and, depending on excess solder material, remaining solder connection surface portions within the at least one or more further projection sub-areas are only subsequently wetted at least regionally; and d) cooling the solder material, wherein, in a region of the at least one first cohesive projection sub-area, the solder layer is formed with an edge corresponding to the at least one first cohesive projection sub-area, and with the defined layer thickness, wherein the excess solder material is buffered in a region of the at least one or more further projection sub-areas.

17. The connecting arrangement according to claim 1, wherein:

the two connecting partners are one above the other with the solder connection surfaces (I) facing one another oriented parallel to one another and (II) at a distance from one another; and the solidified solder layer is formed:

(I) of a solder material arranged between the solder connection surfaces;

(II) with a defined edge; and (III) by:

(i) a melting of the solder material and wetting of the solder connection surface parts such that all solder connection surface parts within the at least one first cohesive projection sub-area are wetted first and, depending on excess solder material, remaining solder connection surface portions within the one or more further projection sub-areas are only subsequently wetted at least regionally; and (ii) a cooling of the solder material such that, in a region of the at least one first cohesive projection sub-area, the solder layer is formed with an edge corresponding to the at least one first cohesive projection sub-area, with excess solder material being buffered in a region of the one or more further projection sub-areas.

18. The connecting arrangement according to claim 1, wherein:

the first and second connecting partners are arranged parallel to one another at a defined distance corresponding to the solder layer thickness;

the solidified solder layer has a defined peripheral edge corresponding to a boundary of the at least one first cohesive projection sub-area; and the solder layer is fully formed within the at least one first cohesive projection sub-area and only regionally extending into the one or more further projection sub-areas, with excess solder material being solidified and buffered in a region of the one or more further projection sub-areas.

\* \* \* \* \*